US011290584B2

(12) United States Patent
Shaw et al.

(10) Patent No.: US 11,290,584 B2
(45) Date of Patent: *Mar. 29, 2022

(54) SPINNING ACCESSORY FOR MOBILE DEVICE

(71) Applicants: Scott Phillip Shaw, Isle of Palms, SC (US); Omer Salik, Hermosa Beach, CA (US)

(72) Inventors: Scott Phillip Shaw, Isle of Palms, SC (US); Omer Salik, Hermosa Beach, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/023,794

(22) Filed: Sep. 17, 2020

(65) Prior Publication Data
US 2021/0029229 A1 Jan. 28, 2021

Related U.S. Application Data

(63) Continuation of application No. 16/735,221, filed on Jan. 6, 2020, now Pat. No. 10,855,826.

(60) Provisional application No. 62/790,986, filed on Jan. 10, 2019.

(51) Int. Cl.
| H04M 1/04 | (2006.01) |
| F16M 13/00 | (2006.01) |
| F16M 11/10 | (2006.01) |
| F16M 11/38 | (2006.01) |
| F16M 11/20 | (2006.01) |
| H04M 1/02 | (2006.01) |
| H05K 5/02 | (2006.01) |
| G06F 1/16 | (2006.01) |

(52) U.S. Cl.
CPC .............. *H04M 1/04* (2013.01); *F16M 11/10* (2013.01); *F16M 11/2078* (2013.01); *F16M 11/38* (2013.01); *F16M 13/005* (2013.01); *H04M 1/026* (2013.01); *H05K 5/0204* (2013.01); *G06F 1/1626* (2013.01); *H05K 5/023* (2013.01); *H05K 5/0234* (2013.01)

(58) Field of Classification Search
CPC .......... H04B 1/04; H04M 1/04; G06F 1/1633; G06F 11/00
See application file for complete search history.

(56) References Cited

U.S. PATENT DOCUMENTS

| 8,560,031 | B2 | 10/2013 | Barnett et al. |
| 9,958,107 | B1 | 5/2018 | Hobbs et al. |
| 9,970,589 | B2 | 5/2018 | Hobbs et al. |
| 10,030,807 | B1 | 7/2018 | Hobbs et al. |
| 10,054,259 | B2 | 8/2018 | Hobbs et al. |
| 10,060,573 | B2 | 8/2018 | Hobbs et al. |
| 10,215,329 | B2 | 2/2019 | Hobbs et al. |
| 10,348,352 | B2 | 7/2019 | David et al. |
| 10,317,005 | B2 | 8/2019 | Hobbs et al. |

(Continued)

*Primary Examiner* — Thanh C Le

(57) ABSTRACT

A mobile device accessory comprising a base that affixes to a mobile device, and a rotating element, such as a rotary ball-bearing disc, coupled to said base allowing for the device to spin along the axis of the rotating element. The accessory may further comprise hinged or extendable arms. The accessory may further comprise a power source or motor for rotating the accessory. The accessory may further comprise a control circuit coupled to a software application capable of controlling the rotation of the spinning element.

11 Claims, 4 Drawing Sheets

(56) References Cited

U.S. PATENT DOCUMENTS

| | | |
|---|---|---|
| 10,386,009 B2 | 8/2019 | Hobbs et al. |
| 10,655,775 B2 | 5/2020 | Hobbs et al. |
| 10,735,572 B2 | 8/2020 | Altan et al. |
| 10,742,251 B2 | 8/2020 | Molly et al. |
| 2018/0288204 A1* | 10/2018 | Nahum .................... H04M 1/04 |
| 2020/0099413 A1* | 3/2020 | Kim ...................... H04M 1/185 |
| 2020/0235770 A1* | 7/2020 | Yim ...................... H04B 1/3877 |
| 2021/0119660 A1* | 4/2021 | Yu ........................ A45C 13/008 |

* cited by examiner

SPINNING ACCESSORY FOR MOBILE DEVICE

The present application is a continuation of and claims priority to the earlier filed U.S. non-provisional utility application Ser. No. 16/735,221 filed on Jan. 6, 2020, which claims priority to U.S. provisional application having Ser. No. 62/790,986 filed on Jan. 10, 2019 and hereby incorporates the subject matter of the provisional application in its entirety.

FIELD OF THE INVENTION

The present invention relates to cases, attachments and similar accessories for mobile devices and portable media players. In particular, embodiments of the one or more present inventions relate to a mobile device case, attachment or accessory that includes a spinning component for spinning the mobile device.

BACKGROUND OF THE INVENTION

Mobile devices, including portable media players, are often affixed with attachments or housed in protective covers or cases in order to help grip the device or protect the device from breaking, scratching or other damage. Such cases increase the effective size of the media player and often provide no function other than gripping or limited protection of the device.

Some device cases include an extra feature to enable further functionality beyond protection. For instance, some cases have extendable components for standing the mobile device on one of its sides. Other cases have grips or finger holes to improve gripping of the mobile device. One shortcoming of each of these cases is that they are designed primarily to maintain the mobile device in a stationary state and do not provide the user with a new mechanic for engaging with the mobile device, such as spinning the device. Rather, each of these cases only improve functionality of existing physical interactions with the device, such as gripping or standing the device. It is also known in the prior art to provide toys that people can spin about a point, such as a top or a fidget spinner.

A need remains in the art for mobile device cases and accessories that perform a multitude of functions, as noted above, without adding significantly to the effective size of the device and that provides users with a new mechanism for engaging with the device, such as the ability to spin the mobile device. Moreover, a need remains to provide a software application that functions with the new mechanism for engaging with the mobile device.

BRIEF SUMMARY OF THE INVENTION

One or more embodiments of the one or more present inventions are directed to a mobile device case, attachment or accessory that includes a spinning component such that the mobile device itself can be spun around an axis of the device case. The spinning of the device may be performed manually or through a power source and motor coupled to the device case, attachment or accessory. Additional embodiments include additional case functionality, such as an extending component for cord management, to provide a stand or to aid in gripping the device.

Still further embodiments include one or more software applications that work together with the spinning function of the case or accessory. For example, a software application may be provided that provides different interactive games based on the spinning of the device using the accelerometer and compass functions of the device. Other software applications may provide for a light show or other visual effects based on the spinning of the device. Other software applications may provide for spinning of the device in response to other software applications, such as music being played.

While aspects of the invention may be described herein with reference to various embodiments, it should be appreciated that any such examples are for illustrative purposes only and are not intended to be limiting.

DETAILED DESCRIPTION

The embodiments described herein relate to one or more inventions relating to a mobile device case, attachment or accessory that includes a spinning component. One or more embodiments of the one or more present inventions are directed to a mobile device case, attachment or accessory that, in addition to a spinning component, provides extending arms for serving other purposes, such as one or more of managing cords, forming standing legs, gripping or clipping. One or more embodiments of the one or more present inventions are directed to providing a software application that is responsive to the spinning motion of the mobile device provided by the case.

The accessory or case may include an adhesive plate for coupling to the back of the mobile device and at least one rotary ball bearing component or other spinning mechanism in the center of the plate. In other embodiments, the accessory or case may fit around the perimeter of the mobile device. In preferred embodiments, the attachment structure and its components are relatively thin so as to not add substantial depth to the mobile device.

Figure 1:
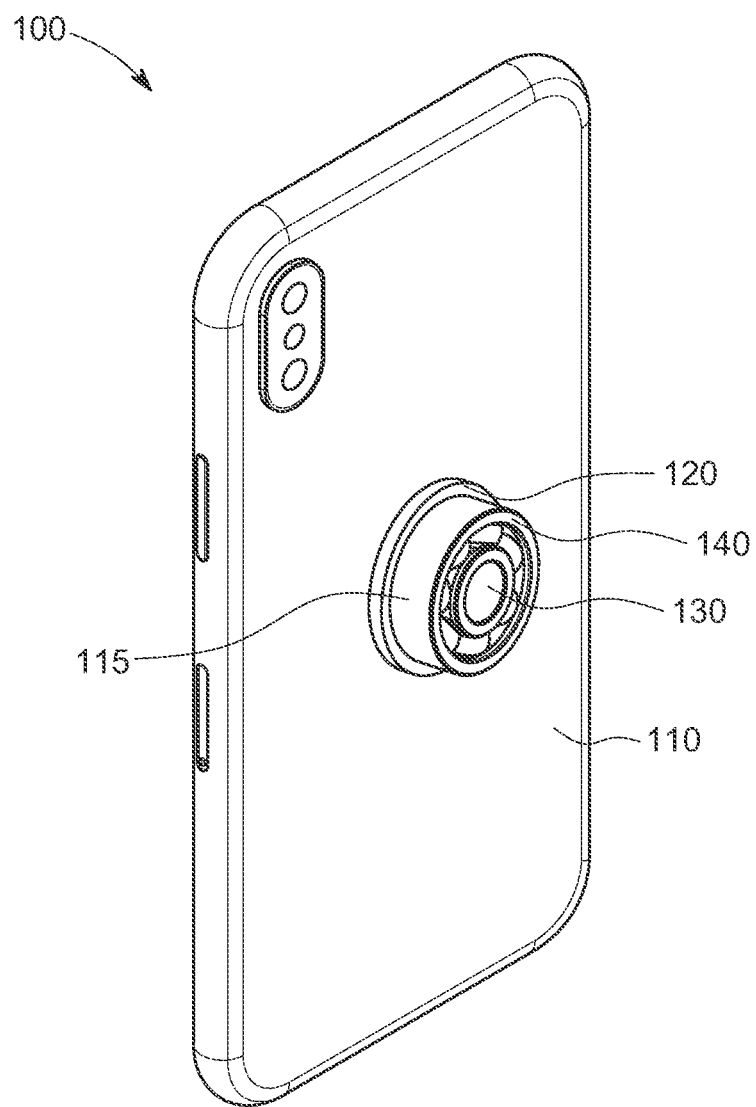
FIG. 1 shows an embodiment of a mobile device attachment consistent with one or more of the present inventions.

Referring to FIG. 1, which depicts an embodiment of a mobile device having an attachment consistent with one or more of the present inventions 100. The mobile device 110 typically has a generally rectangular shape, though the attachment disclosed herein may be used on any shaped device. The embodiment shown in FIG. 1 includes a circular ball bearing device 115 that is affixed to the back of the mobile device 110 via an adhesive disc 120. The ball bearing device 115 is generally comprised of a rotating assembly 130, 140 having multiple rings containing balls in between. The ball bearing device 115 may be made of metal, ceramic, plastic or other known materials suitable for rotation assemblies. In other embodiments, hub and spoke assemblies, axle assemblies or other known rotational assemblies may be used instead of a ball bearing device.

In certain embodiments, the adhesive disc 120 is coupled to the exterior circumference of the ball bearing device 140. In other embodiments, the adhesive disc may be coupled to the circumference of the interior ring 130 ball bearing device 140. In other embodiments, the adhesive disc 120 may incorporated into an inner axle situated in the center 130 of the ball bearing device 115. The adhesive disc 120 may be made of plastic, metal or other material and includes an adhesive backing so that it may be attached to the surface of the mobile device 110. The surface of the adhesive disc 120 is comprised of an adhesive material of sufficient strength to affix the ball bearing assembly 115 to the back of the mobile device 110 to allow the mobile device 110 to rotate on the center axis of the ball bearing device 115.

In other embodiments, the attachment 100 may use other known methods for being physically affixed to the mobile device 110 other than adhesives. For example, the attachment 100 may be physically affixed to the mobile device 110 through a magnet. In other embodiments, the attachment 100 may be physically affixed to the mobile device 110 by having a base that extends to and affixes to at least a portion of the outer edge of the mobile device 110.

The mobile device with the disclosed attachment 100 allows the mobile device 110 to be spun around the axis of the rotary ball bearing 140, thus providing the user with a new way to engage with his or her device. Either the interior 130 or exterior 140 components of the ball bearing device 115 may be used for rotation of the mobile device 110 on a surface, such as a desk. In certain embodiments, the inner or outer rings of the ball bearing device may be implemented with a surface having higher friction for better contact with a table or other surface on which the mobile device will spin. In other embodiments, the ball bearing device 140 may be incorporated into a mobile device case.

Figure 2:
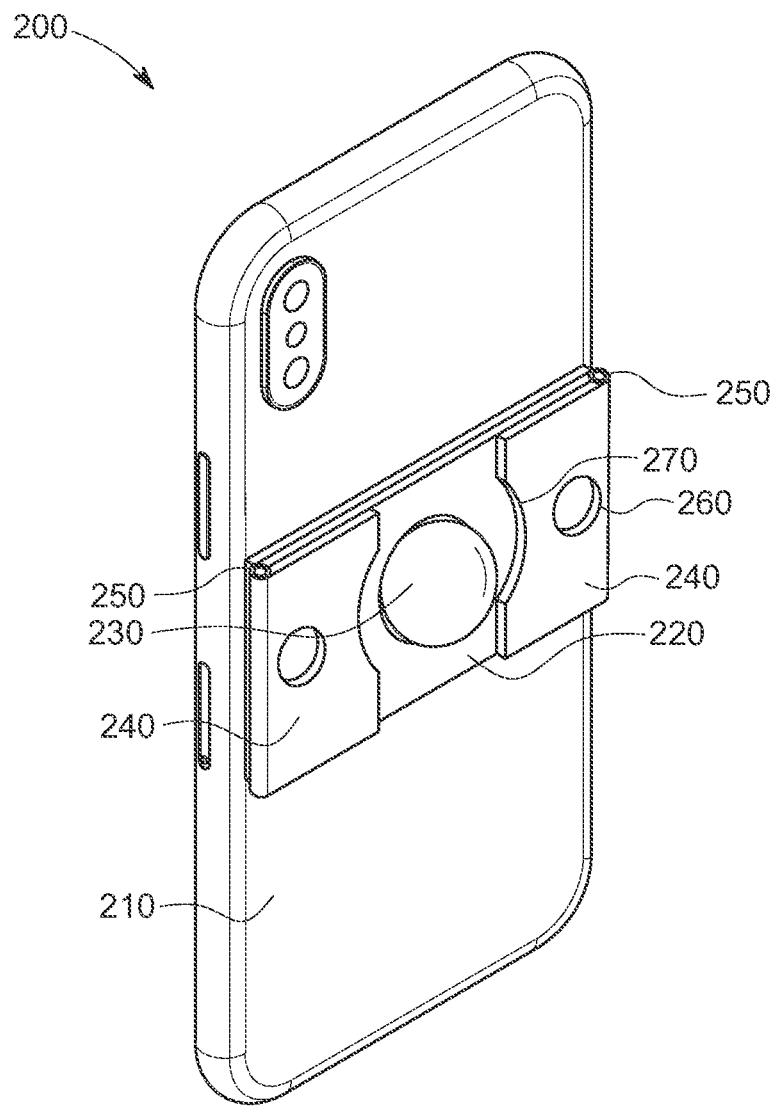
FIG. 2 shows an embodiment of a mobile device attachment consistent with one or more of the present inventions.

Referring to FIG. 2, which depicts another embodiment of a mobile device with an attachment consistent with one or more aspects of the present inventions 200. The embodiment of the attachment shown in FIG. 2 includes a base plate 220 having an adhesive side that may be affixed to the mobile device 210. The base plate 220 has a rotary ball bearing 230. At either end of the base plate 220 are pivoting arms 240 that are affixed to the plate 220 by a hinging mechanism 250. The arms 240 may be folded in to lie flat. The arms 240 may also be rotated outward from the surface of the mobile device 210. Depending on the orientation of the arms 240, the arms may serve as a stand for the mobile device 210 or as grips for the mobile device. In preferred embodiments, the each of the arms 240 includes a hole 260 to allow a user to insert a figure that may help facilitate gripping. In other preferred embodiments, each of the arms 240 includes a curved notch 270 to allow the arms 240 to fold down onto the surface of the mobile device 210 without interfering with the rotary ball bearing 230.

Figure 3:
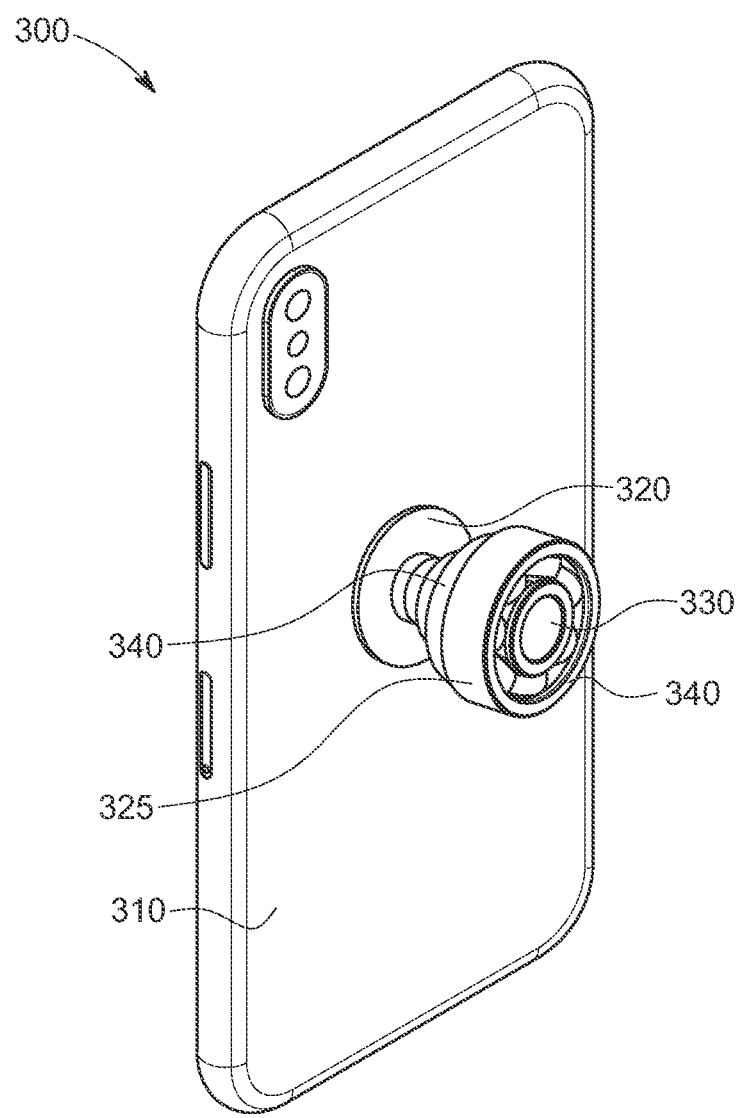
FIG. 3 shows an embodiment of a mobile device attachment consistent with one or more of the present inventions.

Referring to FIG. 3, which depicts another embodiment of a mobile device with an attachment consistent with one or more of the present inventions 300. The embodiment of the case shown in FIG. 3 includes an adhesive plate 320 and rotary ball bearing plate 325. The attachment may be affixed to the mobile device 310 through the adhesive surface of the plate 320. In between the rotary ball bearing 330 and the adhesive pad 320 is an extending element 340. The extending element 340 may be pushed down towards the surface of the mobile device 310 or extended out away from the surface of mobile device 310. The extending element 340 may be comprised of multiple concentric tubes or rings to allow for extension and retraction through a telescoping mechanism. The extending arm 340 may also be implemented through other mechanism, such as an accordion mechanism, screw-rotating (helical) mechanism, multiple alternating hinged plates, or collapsible scissor-arm mechanism.

At the end of the extending element 340 is a ball bearing device 325 having an inner 330 and outer 340 rotating components with ball bearing in between. The mobile device 310 may be spun using the rotary ball bearing 325 whether the extending element 330 is extended or retracted. In some preferred embodiments, either the outer component 340 or inner component of the ball bearing deice 325 may comprise a high-friction to allow for better contact with a surface, such as a desk, to allow for improved spinning of the mobile device 310. When extended, the extending element 334 may be used as a stand or a grip for the mobile device 310.

Figure 4:
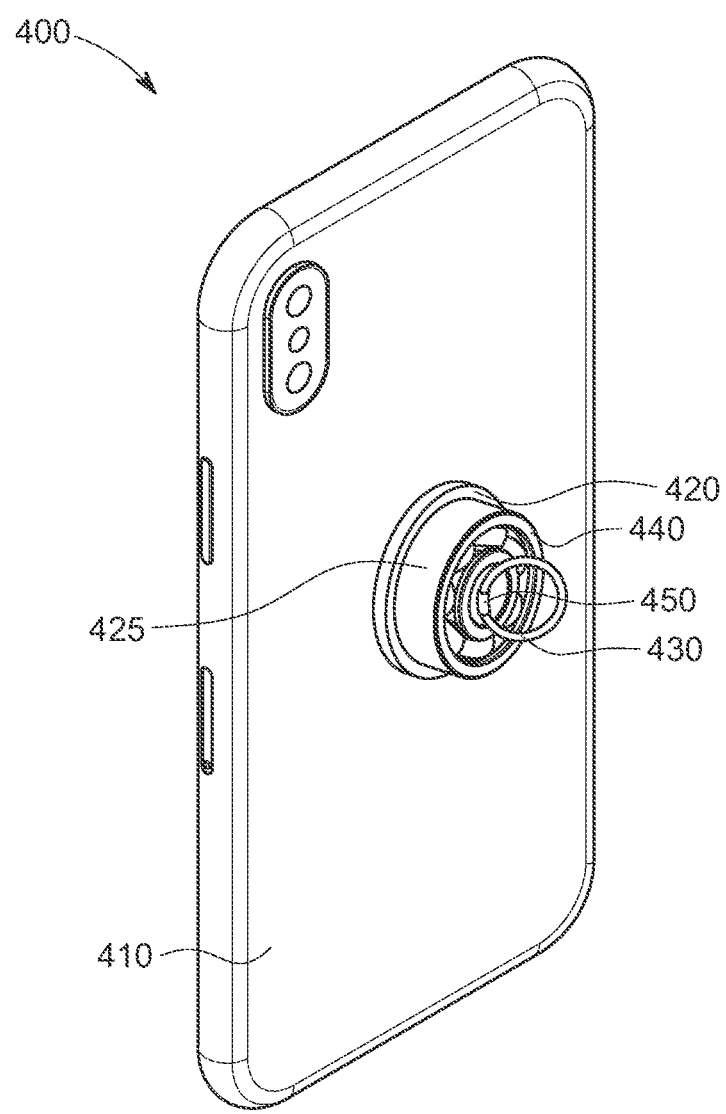
FIG. 4 shows an embodiment of a mobile device attachment consistent with one or more of the present inventions.

Referring to FIG. 4, which depicts another embodiment of a mobile device with an attachment consistent with one or more of the present inventions 400. The embodiment of the attachment shown in FIG. 4 includes an adhesive plate 420 and rotary ball bearing 425 similar to that shown in FIG. 1. The attachment may be affixed to the mobile device 410 through the adhesive surface of the plate 420. Coupled to the inner portion of the ball bearing device 425 is an inner ring 430 that can hinge 450 away from the ball-bearing disc. When extended out, the inner ring 430 can serve as a stand for the mobile device or as a grip. When pushed down, the ring 430 optimally lays flat on the inner disc of the ball bearing device. In alternative embodiments, the ring 430 fits within the recess between the two ball bearing discs along the inner circumference of the outer ball bearing ring 440.

For each of the one or more embodiments disclosed herein for the one or more inventions disclosed herein, the mobile device attachment or case may include a power source, such as a battery, a power cord for connecting to the mobile device or other power source, or an induction circuit for receiving power from the mobile device or other inductive source. The power source may be coupled to a rotating motor to power the rotation of the ball bearing device of the accessory to spin without manual power. The power source and rotating mechanism may be housed in the adhesive plate or in the ball bearing device itself. The power source may be a battery, such as a 3V battery commonly used in watches, or other type of replaceable or rechargeable battery. In other embodiments, the power source may be the phone battery itself, wherein the rotating mechanism is powered through inductive coupling to the phone's battery utilizing the NFC capabilities of modern smart phones.

For each of the one or more embodiments disclosed herein the one of or more inventions disclosed herein, one or more software applications may be downloaded to the mobile device for use in connection with the device case or accessory. The software application may be used to control the spinning of the accessory either through software commands that are communicated to and control the rotation of the motor coupled to the ball bearing device. In other embodiments, the software may control the rotation of the ball bearing device by controlling the inductive power delivered from the device to the accessory's power source and motor.

For example, a software application may provide for sounds, lights or other effects to be emitted from the mobile device in response to the spinning of the device using the case or accessory. Many mobile devices include an accelerometer and compass for detection of orientation that may be used in connection with the software application to detect the speed and direction of the mobile device spinning. Other software applications may spin the device in response to music, using the power source and motor. For example, a software application could provide for a dynamic light show emitted from the mobile device that is coordinating with music playing from the device or elsewhere, where the phone emits lights and spins to create visual effects.

What is claimed is:

1. A system including a mobile device and an accessory for said mobile device, said accessory comprising:

a base having a means for being physically affixed to said mobile device along a first surface of the base;

a ball-bearing affixed to said base on second surface opposite said first surface of said base, said ball-bearing comprised of a first ring and a second ring, wherein said first ring and second ring are concentric and said first ring has a diameter smaller than said second ring;

wherein said second ring provides a rotating wheel and said first ring provides a fixed axle, in which said first ring is stationary and said second ring rotates and wherein said first ring and said second ring are separated by at least four balls interposed in the space between said first and second ring, said balls reducing the friction between said first ring and said second ring;

an arm comprising a collapsible accordion coupled to said ball-bearing, said arm extendable outward from said ball-bearing along the axis orthogonal to said first surface of the base, said arm further retractable back toward said base by collapsing said accordion to form a shape less than an inch in thickness;

a foot affixed to said arm opposite said base;

said arm, when extended, having a cross-sectional diameter proximate said base that is less than the cross-sectional diameter proximate said foot.

2. A system as claimed in claim 1 wherein a software application is installed on said mobile device and said software application is capable of receiving inputs representative of said rotation of said ball-bearing of said accessory.

3. A system as claimed in claim 2 wherein said software application is capable of causing said mobile device to output visual effects in response to said received inputs.

4. A mobile device case less than an inch in thickness comprising:

a base forming a recess, said recess shaped to fit around at least a portion of the outer dimensions of said mobile device;

a ball-bearing affixed to said base comprised of a first ring, a second ring, wherein said first ring and second ring are concentric and said first ring has a diameter smaller than said second ring;

wherein said second ring provides a rotating wheel and said first ring provides a fixed axle, in which said first ring is stationary and said second ring rotates and wherein said first ring and said second ring are separated by at least four balls interposed in the space between said first and second ring, said balls reducing the friction between said first ring and said second ring.

5. A mobile device case as claimed in claim 4, wherein said mobile device case further comprises an electrical power source and motor, wherein said motor is coupled to said ball bearing to rotate said ball bearing.

6. A mobile device case as claimed in claim 5, wherein said electrical power source is an inductive circuit coupled to the power source of said mobile device.

7. A mobile device case as claimed in claim 6 wherein said motor is controllable by a software application installed on said mobile device to alter the rotational speed of said ball bearing.

8. A mobile device case as claimed in claim 7 wherein said software application alters said rotational speed in synchronization with music playing on said mobile device.

9. A mobile device accessory as claimed in claim 4 wherein a software application installed on said mobile device is capable of causing said mobile device to display lighting effects in synchronization with rotation of said ball-bearing of said mobile device accessory.

10. An accessory less than an inch in thickness for attaching to a mobile device or to a mobile device case, comprising:

a securing element for attaching the accessory to the back of the mobile device or mobile device case; and a rotating element connected to the securing element, said rotating element comprising a first ring and a second ring, wherein said first ring and said second ring have different diameters and are positioned concentrically;

wherein said second ring provides a rotating wheel and said first ring provides a fixed axle, in which said first ring is stationary and said second ring rotates and wherein said first ring and said second ring are separated by at least four balls interposed in the space between said first and second ring, said balls reducing the friction between said first ring and said second ring.

11. An accessory as claimed in claim 10 wherein a software application installed on said mobile device is programmed to display lighting effects on said mobile device in synchronization with rotation of said rotating element of said accessory.

\* \* \* \* \*